United States Patent [19]

Dugan et al.

[11] Patent Number: 4,878,294

[45] Date of Patent: Nov. 7, 1989

[54] ELECTROFORMED CHEMICALLY MILLED PROBES FOR CHIP TESTING

[75] Inventors: William P. Dugan, Glendora; Marvin R. Johnson, Mira Loma, both of Calif.

[73] Assignee: General Dynamics Corp., Pomona Division, Pomona, Calif.

[21] Appl. No.: 208,907

[22] Filed: Jun. 20, 1988

[51] Int. Cl.[4] .............................................. H01K 3/10
[52] U.S. Cl. ....................................... 29/852; 204/15
[58] Field of Search .................. 204/15; 156/650, 651; 29/852

[56] References Cited

U.S. PATENT DOCUMENTS

| | | |
|---|---|---|
| 2,734,150 | 2/1956 | Beck . |
| 2,961,746 | 11/1960 | Lyman . |
| 3,324,014 | 6/1967 | Modjeska . |
| 3,447,960 | 6/1969 | Tonozzi . |
| 3,462,349 | 8/1969 | Gorgenyi . |
| 3,716,907 | 2/1973 | Anderson . |
| 3,761,309 | 9/1973 | Schmitter et al. . |
| 3,901,770 | 8/1975 | Littwin ................................ 204/15 |
| 3,904,461 | 9/1975 | Estep et al. . |
| 3,993,515 | 11/1976 | Reichert ......................... 204/15 X |
| 3,997,963 | 12/1976 | Riseman . |
| 4,005,472 | 1/1977 | Harris et al. ...................... 204/15 X |
| 4,067,104 | 1/1978 | Tracy . |
| 4,125,310 | 11/1978 | Reardon, II . |
| 4,125,441 | 11/1978 | Dugan . |
| 4,139,434 | 2/1979 | Dugan . |
| 4,141,782 | 2/1979 | Dugan et al. . |
| 4,221,047 | 9/1980 | Narken et al. . |
| 4,236,777 | 12/1980 | Merlina et al. . |
| 4,293,637 | 10/1981 | Hatada et al. ................... 204/15 X |
| 4,334,349 | 6/1982 | Aoyama et al. . |
| 4,649,338 | 3/1987 | Dugan . |

OTHER PUBLICATIONS

IBM Technical Disclosure Bulletin, vol. 22, No. 5, Oct., 1979, pp. 1821–1822.
IBM Technical Disclosure Bulletin, vol. 21 No. 6, Nov. 1978, pp. 2553–2554.
IBM Technical Disclosure Bulletin, vol. 11, No. 5, Oct. 1968, p. 506.

Primary Examiner—Howard N. Goldberg
Assistant Examiner—Carl J. Arbes
Attorney, Agent, or Firm—Henry Bissell; Leo R. Carroll

[57] ABSTRACT

A method for manufacturing a probe test structure for microcircuits utilizes a multiple coating method in conjunction with a novel double-cell electroplating apparatus having a relatively high-resistance ion path between the cells. Photoresist is applied to both sides of a copper foil, copper posts are electroformed onto selected areas of one side of the foil through image hole patterns, the remaining photoresist is stripped away, polyimide prepreg is laminated to the post side of the foil, the copper posts are exposed by sanding, photoresist is reapplied to both sides of the sanded remainder, additional copper is electroformed on each post through image hole patterns in the post side of the photoresist, the foil on the side opposite the posts is chemically milled to provide leads integral with each post using appropriate masking techniques and, finally, all of the remaining photoresist is removed to leave the desired test probe set. In a second embodiment, nickel plating is added over the copper to acheive selective etching, permitting processing of both sides of the copper foil simultaneously.

19 Claims, 3 Drawing Sheets

ELECTROFORMED CHEMICALLY MILLED PROBES FOR CHIP TESTING

BACKGROUND OF THE INVENTION

1. Field of the Invention.

The present invention relates to microcircuitry test equipment and, more particularly, to probe test connections to chips after tape or bumped tape has been attached.

2. Description of the Related Art.

Many processes exist for the production of microcircuit test probes. For example, probes have been designed which are disposed over a recess, and the testing circuit is brought into contact by bending the probes into the recess. Probes have also been produced by bending metallic elements, as disclosed, for example, in U.S. Pat. No. 3,702,439 to McGahey et al. In U.S. Pat. No. 3,832,632, Ardezzone has suggested a flexible coating over a probe head. Probes have also been embedded in flexible structures by processes such as those suggested in U.S. Pat. Nos. 3,810,016 to Chayka et al and 3,835,381 to Garretson et al.

In the disclosed methods and structures, at least some bending is performed on the probe or a related metal structure, either during manufacture or during operation. Bending leads to fatigue and breakage, especially in the case of microcircuits, since the element to be bent is very fine. In addition, probes meant to be bent are relatively flat and are thus relatively weak.

Another method for the production of microcircuit probes includes welding of an aligned probe to a preformed base which has, integral in it, a flexible area. As disclosed by Best et al in IBM Technical Disclosure Bulletin, Vol. 15, No. 11 (April, 1973), the mandrel for the base is then removed to produce a flexible testing unit. The process requires microwelding or brazing.

In U.S. Pat. No. 4,649,338 to Dugan, a process is disclosed which improves on previous processes requiring microwelding or brazing by directly forming the probes in the proper angular relationship to the remainder of the unit. The disclosed method produces new and improved fine-line probes for connection to very fine circuits.

U.S. Pat. No. 4,125,310 discloses the fabrication of printed circuit contact terminations having a plurality of copper buttons covered with a very thin layer of gold plating. A plurality of these contacts, mounted on a wafer in opposed juxtaposition to a corresponding pattern of adjacent circuit contacts, is brought together with the other circuit terminations and pressure is applied sufficient to force-flow the gold layer to develop a gas-tight seal between the opposed surfaces. Such an arrangement lends itself to separation and re-sealing of the contact arrays, thereby providing a special purpose circuit connector.

Further improvements in processes in which probes are formed directly should have the desirable characteristics of (1) enabling reproduction of the probe section of a tester for microcircuits without great difficulty; (2) producing a tester that has relatively rigid probes which are manufactured independent of each other; (3) producing probes that are not easily bendable toward or away from each other; and (4) producing probes which do not break easily.

SUMMARY OF THE INVENTION

The desirable characteristics listed above are realized by an improved method of manufacturing fine-line probes for connection to microcircuits. A multiple coating method provides probe test connections on chips subsequent to attachment of tape or bumped tape to the chip. The process involves application of photoresist to both sides of a copper foil, electroforming copper posts onto selected areas of one side of the foil through image hole patterns in the photoresist of that side, stripping all of the remaining photoresist from the foil, laminating polyimide prepreg to the post side of the foil completely covering it, exposing the copper surface of the posts by a sanding operation, re-applying photoresist to both sides of the sanded remainder, electroforming a second copper probe coating on each post through appropriate image hole patterns in the post side of the resist, chemically milling the foil on the side opposite the posts so as to provide leads integral with each post by way of appropriate masking techniques, and, finally, removing all of the remaining photoresist to produce the desired unit.

In a second method in accordance with the present invention, processing of the copper foil proceeds simultaneously from both sides. Pattern images are developed from both sides of the copper sheet, the underside forming a plurality of image holes while the upper side forms a lead pattern. After the circuit leads and posts are built up by electroforming copper on to the exposed areas on both sides of the copper foil, a further electroplating step is formed to deposit a thin layer of nickel plate over the built up copper. This permits selective etching of the foil during the chemical milling step and saves substantial time in the process by combining some of the sequential steps of the first-mentioned method.

The electroforming steps in the present process are preferably performed by resort to a double-cell electroplating process disclosed in U.S. patent application Ser. No. 197,793 of William P. Dugan et al, assigned to the assignee of the present invention.

BRIEF DESCRIPTION OF THE DRAWING

A better understanding of the present invention may be realized from a consideration of the following detailed description, taken in conjunction with the accompanying drawing in which.

DESCRIPTION OF THE PREFERRED EMBODIMENT

First Embodiment

Figure 1A:
FIGS. 1A–1M illustrate the steps performed in producing the probe structure of a first embodiment of the present invention.
Figure 1B:
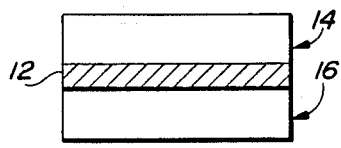
Figure 1C:
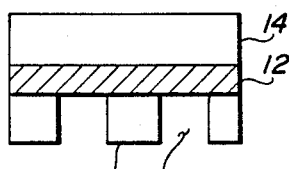

FIGS. 1A–1M illustrate the individual sequential steps in a process for providing probe test connections on microcircuit chips according to one embodiment of the present invention. The probe test contacts fabricated by the process shown in FIGS. 1A–1M are illustrated in FIG. 2, which is a bottom view of the probe contacts shown in cross section in FIG. 1M.

The process of this embodiment begins with a copper foil sheet 12 which is 0.0014 inch thick. Sheet 12 is laminated with two layers of photoresist 14 and 16, each 0.0026 inch thick, on opposite sides of the copper foil sheet 12. These thin layers are taken from rolls and fed through a laminating machine, after which panels measuring 3 11 are cut out.

The photoresist 16 on one side of the panel is then exposed to a hole pattern image while the photoresist layer 14 on the other side of the panel is protected from exposure. After developing and washing, a pattern of holes 1 appears in the photoresist layer 16, as shown in FIG. 1C. The development step takes place in a "yellow room" while the layer 14 of photoresist is protected.

The electroforming of copper posts 20 in the holes 18 is effected by means of a novel double-cell electroplating apparatus and method disclosed in U.S. patent application Ser. No. 197,793 of William P. Dugan et al, assigned to the assignee of the present invention. The disclosure of that application is incorporated herein by reference. For better understanding of the present invention, a description of that novel electroplating apparatus and method follows.

Figure 3:
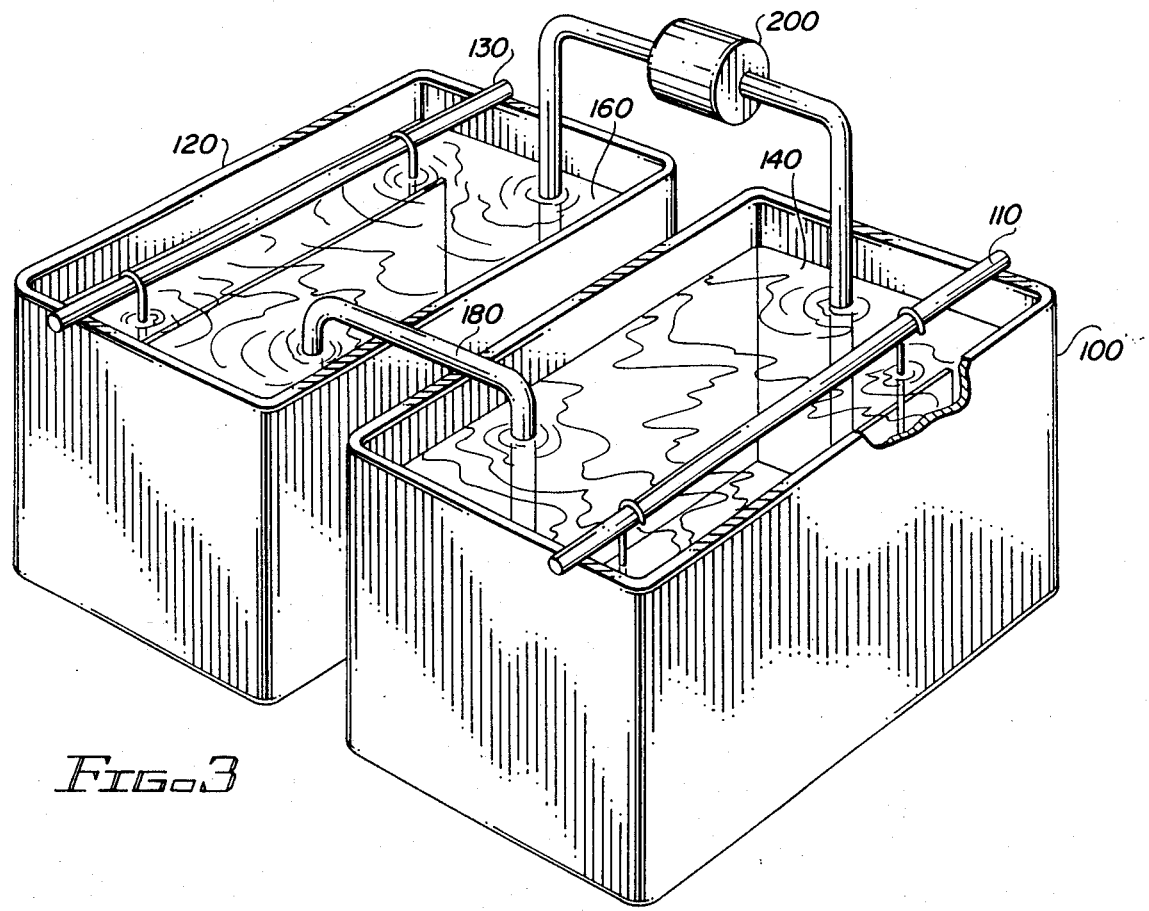
FIG. 3 is a perspective drawing of a double-cell electroplating apparatus which may be used in the present invention.

FIG. 3 shows one possible arrangement of the novel double-cell electroplating apparatus which may be used in the present invention. A first cell 100 has an anode 110 situated therein and a second cell 120 has a cathode 130 placed in it. Cells 100 and 120 are filled with electrolytic solution 140 and 160 in amounts sufficient to contact the electrodes. A wide variety of electrolytic solutions are usable. External circuit connections have been omitted for simplicity.

An example of a suitable copper plating solution is:
$CuSO_4.5_2O = 70.166$ grams/liter
$H_2SO = 184.643$ grams/liter
$Cl = 0.068$ grams/liter FIG. 3 shows a pump/filter apparatus 200 which passes electrolyte from cell 100 to cell 120, thereby effectively continuously recirculating and mixing the electrolyte 140 and 160. The latter function is important because during the electroplating process gas is evolved at the cathode 130 which may become trapped on the surface of the object being plated, and this can cause uneven deposition. By agitating the electrolyte 160, bubbles of gas can be kept from collecting.

FIG. 3 further shows a tube 180 which connects cells 100 and 120 and performs as a siphon. The siphon tube 180 acts to return electrolyte from cell 120 to cell 100. While FIG. 3 reveals a single tube 180, multiple tubes could be used to achieve the same effect. It is important to note that what is being disclosed is not the mere use of a siphon, but rather a means of establishing a relatively high-resistance ion path between the two cells 100 and 120, cell 120 containing the cathode 130 and cell 100 containing the anode 110, via the siphon tube 180 and the path containing the pump/filter 200.

An additional function of the pump/filter apparatus 200 is to filter out anodal material, dirt, or other foreign matter present in the plating cells. It is desirable to filter the electrolytic solution to prevent roughness of the deposit due to extraneous materials in the solution. Since the anode 110 is the principal source of particulate material in the electrolyte, filtering the electrolyte as it is pumped from cell 100 to 120 effectively maintains the electrolyte 160 in which the cathode 130 is immersed clean and clear of impurities, thereby materially improving the quality of the plating layer on the cathode element. Although the use of a filter integral with the pump of apparatus 200 is one convenient way of achieving this end, the filtering device could be a separate element in series with apparatus 200. Similarly, a separate agitation means apart from the apparatus 200 could be used to agitate the electrolytic solution.

Figure 4:
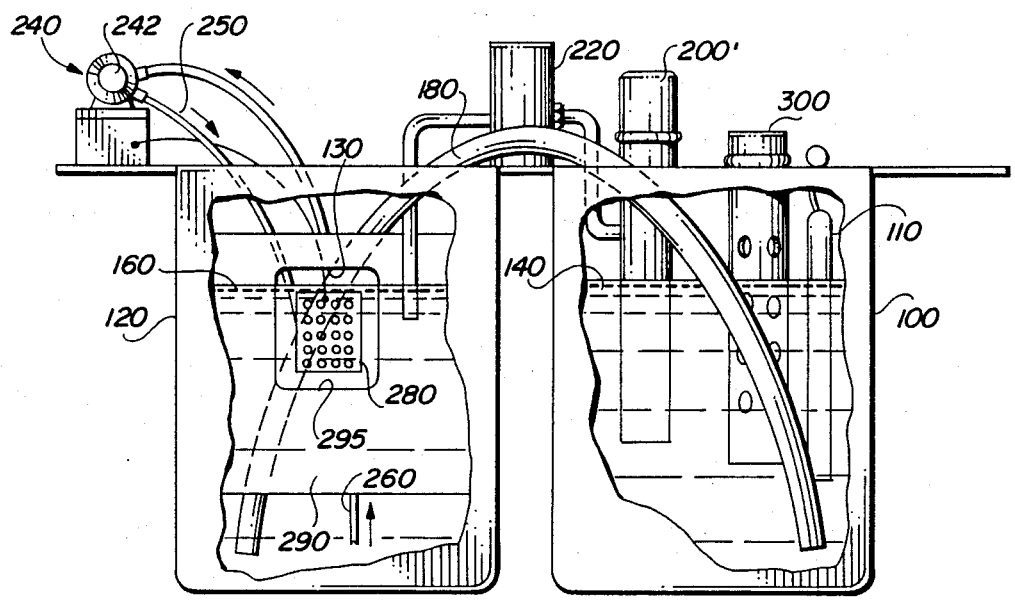
FIG. 4 is a partially broken away side view of another embodiment of the double-cell electroplating apparatus of FIG. 3.

FIG. 4 is a partially broken away side view of another possible double-cell electroplating arrangement which can be used in the present invention. As before, a siphon tube 180 moves electrolyte from cathode cell 120 to cell 100 by siphoning action. Pump 210 pumps electrolyte from anode cell 100 to cell 120. In the arrangement of FIG. 4 a separate filtering means 220 and agitation means 240 are provided. Agitation means 240 takes the form of an additional pump 240 that circulates plating solution 160 through tubes 250 and 260. Intake tube 260 accepts electrolyte from the lower part of cell 120 which is pumped by agitation means 240 through tube 250 to a part of the solution where the object to be plated 280 is attached to cathode 130. Object 280 is surrounded by a plastic cathode shield 290. Cathode shield 290 consists of a plastic sleeve or envelope into which object 280 can be inserted in preparation for plating. A window 310 on one side of cathode shield 295 allows electrolyte 160 to reach object 280 when it is positioned in the center thereof.

An additional feature shown in the arrangement of FIG. 4 is the heater 300 situated in cell 100 to heat the electrolytic solution. The temperature of the electrolytic solution affects several of the factors in processes involved in electroplating, such as the solubility of metal salts and evolved gases and the rate at which chemical reactions take place.

The plating process used in the present invention was found in trials to proceed satisfactorily for a variety of different current densities. Particularly useful was an average current density of 20 amperes/ft$^2$ which produced a plated layer incrementation of about 0.001 inch per hour. Excellent results are also realized with a current density of about 125 amperes/ft.$^2$.

Figure 1D:
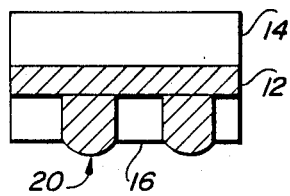
Figure 1E:
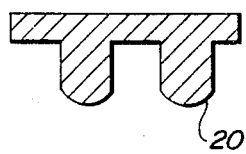
Figure 1F:
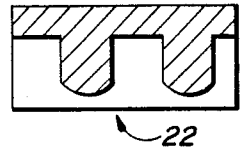
Figure 1G:
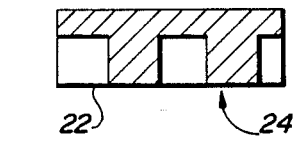
Figure 2:
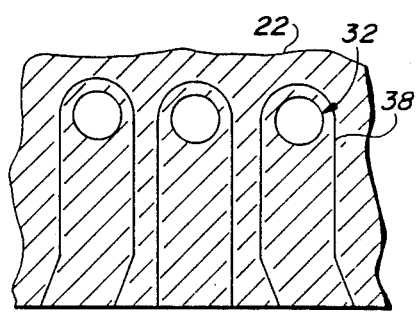
FIG. 2 is a bottom view of the probe shown in a cross sectional view in FIG. 1M.

Continuing with the description of the first embodiment and following the electroforming of the copper posts 20 in the holes 18 of FIG. 1D, photoresist layers 14 and 16 are stripped from copper sheet 12 and copper posts 20 to give the result shown in FIG. 1E. Next a lamination of polyimide prepreg 22 is applied to the post side of the panel, as shown in FIG. 1F. The post side is then sanded until flat surfaces 24 of the posts 20 are exposed. The result is shown in FIG. 1G.

Figure 1H:
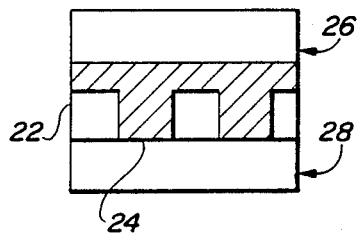
Figure 1I:
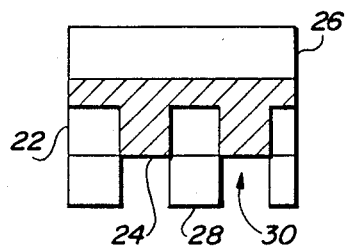
Figure 1J:
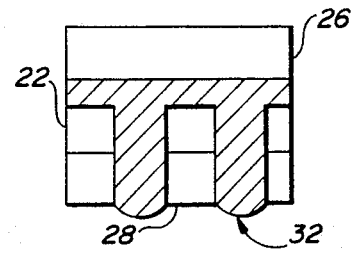

The next three steps in the process of fabrication are essentially identical to ones which were carried out earlier. First, both sides of the panel are laminated with layers of dry photoresist 26 and 28 which are each 0.0026 inch thick, as shown in FIG. 1H. Second, photoresist layer 28 is exposed to the identical hole pattern image used previously to expose photoresist layer 16. Photoresist layer 26 is protected from exposure during this step. Subsequent development of the hole pattern image results in the exposure of the sanded copper posts 24, as shown in FIG. 1I. Third, longer copper posts 32 are electroformed by again using the novel double-cell electroplating apparatus and method described above.

Figure 1K:
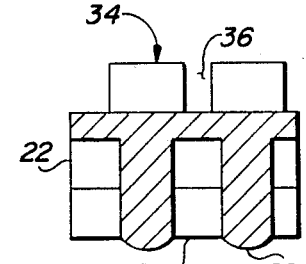

Now photoresist layer 26 is exposed to an image of a lead pattern. Development of the lead pattern image leaves a plurality of covered areas 34 corresponding to where the leads will be, as shown in FIG. 1K. Between areas 34 are openings 36 in which the original copper foil sheet is exposed.

Figure 1L:
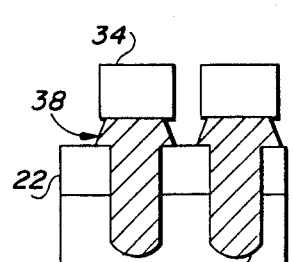

A chemical milling step is now performed by allowing a chemical etchant, preferably ferric chloride, to etch through the copper foil sheet wherever the openings 36 exist. The electroformed copper posts 32 are, of course, protected from the etchant in this step by an added layer of photoresist 28. The result is shown in FIG. 1L, where leads 38 remain after the chemical milling is completed, each of the leads having a probe contact 32 on the under side.

Figure 1M:
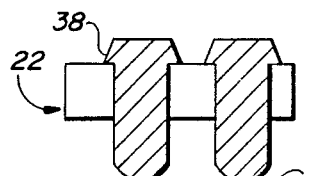

The final step in the process is to remove all the remaining photoresist 28 and 34 to leave a pattern of leads 38 with connecting copper posts 32 extending through a layer of polyimide 22. This is illustrated in the sectional view of FIG. 1M. A bottom view of the resulting product shown in FIG. 1M is given in FIG. 2, which shows the finished probes 32 projecting through a transparent polyimide sheet 22 with copper leads 38 on the remote side and visible through the polyimide sheet.

The plurality of copper posts 32 constitute microcircuit probes positioned in the dielectric base of polyimide 22 having lead connections 38 on the other side of the base to which probe circuitry can be attached. The thickness of the original photoresist layers 16 and 28 determines the length of the probes 32, and the thickness of the photoresist layer on top of the polyimide layer 22 determines the maximum extent of protrusion of the probes 32 from the polyimide base layer 22 in the final product. The particular design and testing to be done with the probes will determine the values to be chosen for these thicknesses.

Second Embodiment

FIGS. 5A–5L illustrate the individual sequential steps in an alternative process for providing probe test connections for testing microcircuit chips according to a second embodiment of the present invention. The probe test contacts fabricated by the process depicted in FIGS. 5A–5L correspond to the illustration of FIG. 2

Figure 5A:
FIGS. 5A–5L illustrate the steps performed in producing the probe structure of a second embodiment of the present invention.

As indicated beginning with FIG. 5A, a copper foil sheet 42, 0.0014 inch thick, is laminated between two layers of photoresist 44 and 46, each being 0.0026 inch thick, in the manner already described.

Photoresist layers 44 and 46 on both sides of the panel are exposed simultaneously through respective lead pattern and hole pattern masks. After developing and washing, a pattern of image holes 48 appears on the underside of the copper sheet 42 while a circuit pattern having lead openings 56 on the upper side of the sheet 42 is present.

Figure 5E:
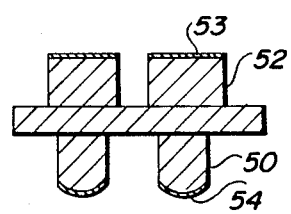
Figure 5I:
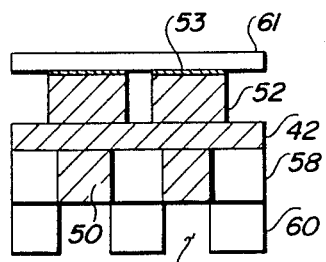
Figure 5B:
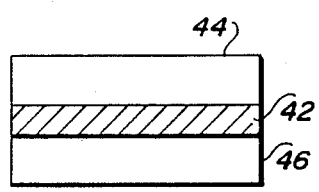
Figure 5F:
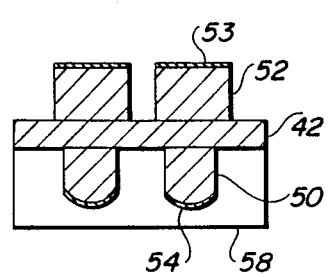
Figure 5J:
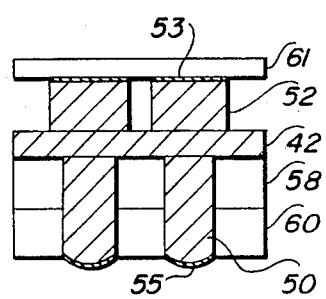
Figure 5C:
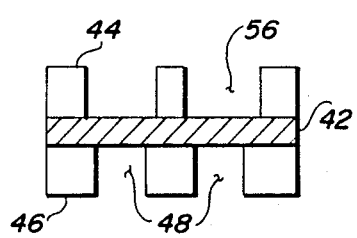
Figure 5G:
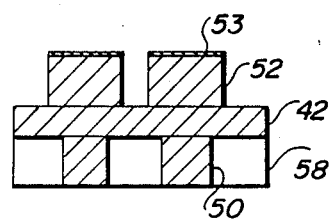
Figure 5K:
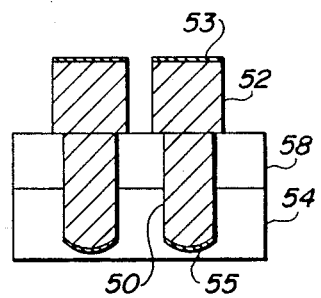
Figure 5H:
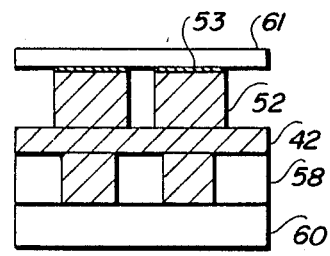
Figure 5D:
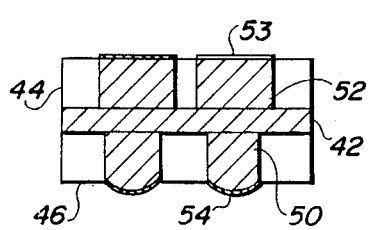

The panel of FIG. 5C is then placed in the electroplating apparatus (FIGS. 3 and 4) for electroforming to build up the copper posts 50 and circuit leads 52 as already described. After copper plating to the appropriate extent as indicated in FIG. 5D, the panel is washed and transferred to a sulfamate nickel plating solution in a similar double-cell electroplating apparatus. An example of a suitable nickel plating solution is:
Nickel sulfamate=75–100 grams/liter
Nickel chloride=10–15 grams/liter
Boric Acid=35–45 grams/liter
This is adjusted to develop a pH of 3.5 to 4.0 with a maximum surface tension of 35.0 dyne/cm. Nickel plating develops a thin layer on the exposed copper surfaces on both upper and lower sides of the panel as indicated in FIG. 5D.

The purpose of the thin nickel plated layer 53 (approximately 0.0001 inch) is to resist the etchant when the copper of the plated structure is selectively etched away. Nickel is not essential; any other metal which will permit the selective etching of copper may be utilized. In addition to permitting the selective etching of the copper layer in a later step, the nickel provides a protective layer for the copper leads and posts to resist oxidation of the copper surfaces in the finished probe product.

Figure 5L:
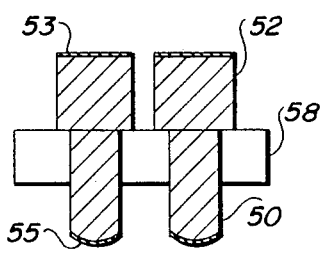

After the first nickel plating step to develop the configuration of FIG. 5D is completed, the photoresist layers 44 and 46 are stripped away, leaving the metal structure of FIG. 5E. Next the copper posts 50 on the underside of the sheet 42 are covered with a layer 58 of polyimide prepreg (FIG. 5F). The lower side of the panel is then sanded to leave a flat surface across the ends of the contact posts 50 which are flush with the surface of the polyimide prepreg 58. Additional dry film photoresist layers 60 and 61 are applied over the top and bottom surfaces of the FIG. 5G configuration as shown in FIG. 5H. These layers are applied from photoresist film tape and, in the case of the layer 61, bridge the leads 52. The lower side of the panel is next exposed to the identical hole pattern as before. After developing and washing, the pattern of holes 62 which is shown in FIG. 5I appears. The structure is again placed in the copper solution electroplating apparatus to further build up the contact posts 50, then in a nickel plating solution to add a layer of nickel 55 on the exposed surfaces of the copper posts 50. During this subsequent electroforming of the contact posts 50, the lead side is rendered inert by the film 61. Thereafter, the photoresist layers 60, 61 are stripped from the upper sides of the sheet 42. The circuit side of the structure is chemically milled by applying a suitable etchant such as sodium persulfate, after adding a layer of photoresist tape 64 along the underside, leaving the panel as shown in FIG. 5K. The posts 50 are protected from the etchant by the layer of resist 64. Finally photoresist layer 64 is removed, resulting in set of leads 52 with attached copper posts (probe contacts) 50 embedded in a sheet of polyimide 58 as shown in FIG. 5L results. Each of the top and bottom surfaces has a protective plated layer of nickel 53, 55 or some other suitable metal.

It will thus be seen that the method comprising the steps shown and described in connection with FIGS. 5A–5L provides an improved process for the fabrication of an improved contact probe configuration. The process of the second embodiment utilizes the steps of the first embodiment but combines some of the steps which are preformed sequentially in the first embodiment into simultaneous process steps in the second embodiment, thereby reducing the time required for the fabrication of a finished product and simplifying the fabrication process.

Furthermore, the provision of the added protective layers of nickel or some other suitable metal over the exposed surfaces of the copper leads and posts permits the combination of the process steps by enabling the selective etching of the copper foil and, in the finished product, provides added protection against oxidation of exposed copper surfaces.

Although there have been described above particular processes of manufacturing a microcircuit probe structure in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A method of fabricating microcircuit test probes having a selected configuration of circuit leads supported on a carrier with an array of probe contacts affixed to the leads, the method comprising the steps of:
    applying layers of photoresist to opposite sides of a metal foil sheet to form a panel;
    exposing the photoresist along a first side of the panel through first mask defining a lead pattern;
    exposing the photoresist along a second side of the panel through a second mask defining a contact pattern;
    developing the photoresist to form a pattern of exposed metal foil along the first side corresponding to the lead pattern image and a plurality of holes exposing metal foil along the second side of the panel corresponding to the contact pattern image;
    placing the panel in an electroplating bath and electroforming contact posts in said holes and leads in said lead pattern image;
    stripping the remaining photoresist from opposite sides of the panel;
    applying a layer of dielectric plastic along the contact side of the panel to encase the contacts;
    removing the outer portion of the dielectric plastic layer and the outer ends of the contacts to develop a substantially planar outer surface;
    adding respective layers of photoresist along the outer surfaces on both sides of the panel;
    exposing the added photoresist along the contact side of the panel through said second mask;
    developing hole patterns in said layer of photoresist added to the contact side of the panel corresponding to said second mask;
    placing said panel in an electroplating bath to further build up the contact posts in the pattern of holes in said added photoresist;
    removing at least the photoresist along the lead side of the panel;
    selectively etching the foil sheet to eliminate metal bridging between respective sets of leads and contacts; and
    removing all remaining photoresist to leave a pattern of leads with associated contact posts extending through the layer of plastic dielectric.

2. The method of claim 1 wherein the steps of placing the panel in an electroplating bath include placing the panel in one cell of a double-cell electroplating apparatus having a relatively high-resistance ion path connecting the cells.

3. The method of claim 2 wherein the metal foil is copper and the electroplating bath comprises copper sulfate.

4. The method of claim 1 further including the step of washing the panel and placing it in a different electroplating bath containing a protective metal electrolyte for selectively plating layers of protective metal over exposed metal surfaces of the panel following each of said steps of placing the panel in an electroplating bath.

5. The method of claim 4 wherein the metal foil is copper, said first-mentioned electroplating bath comprises copper sulfate, and said protective metal is nickel.

6. The method of claim 5 wherein said different electroplating bath comprises nickel sulfamate electrolyte in a double-cell electroplating apparatus.

7. The method of claim 1 wherein the step of removing plastic dielectric comprises abrading the surface of the plastic dielectric and with it any exposed ends of the electroformed contacts to develop a planar surface along the dielectric in which the flattened ends of the contact posts are exposed.

8. The method of claim 7 wherein the dielectric plastic is a polyimide prepreg.

9. The method of claim 1 wherein selected surfaces of the leads and contacts are coated with plated protective metal layer.

10. The method of claim 9 wherein said layer is nickel.

11. The method of claim 1 further including forming a panel from laminated layers of photoresist on opposite sides of the sheet of metal foil by cutting the panels to a predetermined size out of the laminated sheet.

12. The method of claim 1 wherein the steps of exposing and developing the photoresist and electroforming metal on exposed foil surfaces comprise exposing and developing the photoresist on the second side and electroforming contact posts in the holes on the second side prior to exposing and developing the photoresist on the first side and electroforming leads on the exposed metal surfaces on the first side of the panel.

13. The method of claim 1 wherein the step of plating a protective metal layer over exposed surfaces of the leads and contacts is performed prior to the selective etching step.

14. The method of claim 13 wherein the selectively etching step involves applying an etchant to the exposed surfaces of the foil sheet between the leads having a protective metal layer thereon.

15. A method for manufacturing microcircuit test probes comprising the steps of:
    (a) laminating a metal foil sheet on a top side and a bottom side with a thick layer of photoresist;
    (b) exposing said bottom side photoresist to an image of a hole pattern;
    (c) developing said image of said hole pattern to expose a plurality of openings in said photoresist corresponding to said hole pattern;
    (d) electroforming posts in said openings;
    (e) stripping said photoresist from said top and bottom sides of said foil sheet;
    (f) coating said bottom side of said foil sheet and said posts with a dielectric plastic to leave a flat surface;
    (g) removing a surface layer of said plastic to just expose areas of said posts having a maximum cross section;
    (h) laminating the foil-plastic sheet left by step (g) on a top and a bottom side with photoresist;
    (i) repeating steps (b), (c), and (d);
    (j) exposing said top side photoresist to an image of a lead pattern;
    (k) developing said lead pattern image to expose a plurality of openings on said top side of said foil sheet;
    (l) chemically milling said openings on said top side of said metal sheet with an etchant while protecting sad bottom side from contact with said etchant for a time sufficient to form a plurality of leads with posts connected thereto; and (m) removing all remaining photoresist to leave a pattern of leads with connecting posts extending through a layer of plastic dielectric.

16. The method of claim 15 wherein said electroforming steps make use of a double-cell electroplating apparatus having a relatively high-resistance ion path connecting the cells.

17. The method of claim 16 wherein said dielectric plastic is polyimide prepreg.

18. The method of claim 16 wherein said metal foil sheet comprises copper and said etchant in said chemical milling step is ferric chloride.

19. The method of claim 15 wherein said metal foil sheet is 0.0014 inch copper and said photoresist layers each have a thickness of 0.0026 inch.

* * * * *